(12) United States Patent
Cho et al.

(10) Patent No.: US 7,169,681 B2
(45) Date of Patent: Jan. 30, 2007

(54) METHOD OF FORMING DUAL GATE DIELECTRIC LAYER

(75) Inventors: Min-Hee Cho, Gyeonggi-do (KR); Ji-Young Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/964,170

(22) Filed: Oct. 12, 2004

(65) Prior Publication Data
US 2005/0282352 A1  Dec. 22, 2005

(30) Foreign Application Priority Data
Oct. 14, 2003 (KR) .................. 10-2003-0071304

(51) Int. Cl.
  *H01L 21/76* (2006.01)
(52) U.S. Cl. .................. 438/424; 438/157; 438/176; 438/283
(58) Field of Classification Search ............. 438/424, 438/157, 176, 287
See application file for complete search history.

(56) References Cited

U.S. PATENT DOCUMENTS

| | | | |
|---|---|---|---|
| 6,261,978 B1 | 7/2001 | Chen et al. | |
| 6,271,143 B1 * | 8/2001 | Mendicino | 438/700 |
| 6,369,421 B1 | 4/2002 | Xiang et al. | |
| 6,482,715 B2 * | 11/2002 | Park et al. | 438/424 |
| 6,706,577 B1 * | 3/2004 | Twu et al. | 438/199 |
| 6,888,205 B2 * | 5/2005 | Moscatelli et al. | 257/406 |
| 2003/0003639 A1 * | 1/2003 | Kanda et al. | 438/197 |

* cited by examiner

*Primary Examiner*—Dung A. Le
(74) *Attorney, Agent, or Firm*—Marger Johnson & McCollom, P.C.

(57) ABSTRACT

A method of forming a dual gate dielectric layer increases a performance of a semiconductor device by using a dielectric layer having a high dielectric constant, including forming a first dielectric layer having a predetermined thickness on a semiconductor substrate; removing the first dielectric layer formed on a second region, but leaving this layer on a first region; and forming a second dielectric layer having a dielectric constant higher than that of the first dielectric layer, on the first and second regions.

32 Claims, 11 Drawing Sheets

US 7,169,681 B2

METHOD OF FORMING DUAL GATE DIELECTRIC LAYER

CROSS REFERENCE TO RELATED APPLICATIONS

This application claims priority from Korean Patent Application No. 2003-71304, filed on Oct. 14, 2003, the contents of which are hereby incorporated by reference for all purposes.

BACKGROUND OF THE INVENTION

1. Field of the Invention

This disclosure relates to a semiconductor device manufacturing method, and more particularly, to a method of forming a semiconductor device including a dual gate dielectric layer to improve a performance of semiconductor device.

2. Detailed Description of the Related Art

In general, a semiconductor technology related to a structure of a dual gate oxide layer is being variously applied to a semiconductor device such as DRAM. An increasing degree of integration for the semiconductor device increasingly requires miniaturization of the transistor. This also inevitably requires a technology that can provide gate insulation layers having mutually different thicknesses, for transistors formed on a cell array region to directly read and write data, and on a peripheral circuit region of the semiconductor device to operate the transistor of the cell array region. The gate insulation layer of the cell array region, where a relatively high voltage is applied, should be formed thicker than on the peripheral circuit region. In order to fabricate the varying thicknesses, a general photolithography process is employed to form the gate insulation layer.

For example, a first silicon oxide layer having a predetermined thickness is formed by a thermal oxidation process on a semiconductor substrate that is defined as a cell array region and a peripheral circuit region by a device isolation film, afterwhich photoresist is deposited thereon. The first silicon oxide layer has a low dielectric constant of about 3.9.

Next, the photoresist is patterned to expose the first silicon oxide layer provided on the peripheral circuit region through a photolithography process. Then, the first silicon oxide layer formed on the peripheral circuit region is etched by using the photoresist as an etch mask, and the photoresist pattern is removed. Herewith, the etching process on the first silicon oxide layer is performed through a wet etching since a dry etching may damage a surface of the semiconductor substrate.

Lastly, a second silicon oxide layer is formed on the semiconductor substrate on which the first silicon oxide layer is formed. The silicon oxide layer is formed with a mutually different thickness on the cell region and the peripheral circuit region, thereby completing a formation process of the dual gate oxide layer.

Then, a gate electrode is formed on the semiconductor substrate on which the second silicon oxide layer is formed, and a gate protective layer is formed on the gate electrode. Also the gate electrode and the protective layer provided on a source/drain region are removed to form a gate stack on a gate region. A spacer is formed in a sidewall of the gate stack, and a source/drain electrode is formed on both sides of the gate stack so as to form a transistor.

Thus, in the method of forming the dual gate oxide layer according to the prior art, the silicon oxide layer can be formed with mutually different thicknesses on the cell region and the peripheral circuit region through the photolithography process.

However, the dual gate oxide layer forming method based on the prior art causes the following defects.

According to the prior art, the method of forming the dual gate oxide layer is provided to form a gate insulation layer by using a dielectric insulation layer (hereinafter, referred to as "a dielectric layer") that has a dielectric constant higher than those of the first and second silicon oxide layers, but a wet etching process for a partial removal thereof after the formation of the dielectric layer is unstable, thus it is difficult to apply.

SUMMARY OF THE INVENTION

Some embodiments of the invention provide a method of forming a semiconductor device including a dual gate dielectric layer, which can prevent instability of a wet etching process when forming a gate insulation layer by using a dielectric layer having a dielectric constant higher than that of a silicon oxide layer. Also the method can employ the dielectric layer as a gate insulation layer, without the wet etching process for the dielectric layer having the dielectric constant higher than that of the silicon oxide layer.

In one embodiment, according to a method of forming a semiconductor device, a semiconductor substrate is prepared to have first and second regions thereon. A first dielectric layer is formed on the first and second regions of the semiconductor substrate. The first dielectric layer is removed from the second region but a portion of the first dielectric layer is substantially left on the first region. A second dielectric layer having a dielectric constant higher than that of the first dielectric layer is formed on both the first and second regions.

BRIEF DESCRIPTION OF THE DRAWINGS

The above and other features of exemplary embodiments of the invention will become readily apparent from the description that follows, with reference to the attached drawings in which.

DETAILED DESCRIPTION OF THE PREFERRED EMBODIMENTS

Figure 1A:
FIGS. 1a to 1l are cross-sectional views illustrating processes in a dual gate dielectric layer forming method to form a semiconductor device according to a first exemplary embodiment of the invention.

The foregoing and other features and advantages of the invention will be apparent from the more particular description of exemplary embodiments of the invention, as illustrated in the accompanying drawings in which like reference characters refer to the same parts throughout the different views. The invention may be embodied in many different forms and should not be construed as being limited to the exemplary embodiments set forth herein. Rather, these exemplary embodiments are provided so that this disclosure is thorough and complete, and to convey the concept of the invention to those skilled in the art.

FIGS. 1a to 1l are cross-sectional views illustrating processes in a method of forming a dual gate dielectric layer to form a semiconductor device according to a first exemplary embodiment of the invention.

Referring first to FIG. 1a, a first pad oxide layer 102 and a first hard mask layer 104 are sequentially formed on a semiconductor substrate 100. Herewith, the first pad oxide layer 102 is formed with a thickness of about 300 angstroms to 1000 angstroms using a medium temperature oxide (MTO) method. The first hard mask layer 104 is formed of a silicon nitride layer or silicon oxide nitride layer using a chemical vapor deposition (CVD) process. Though not shown in the drawing, a molding polysilicon layer may be further formed between the first pad oxide layer 102 and the first hard mask layer 104.

Figure 1B:
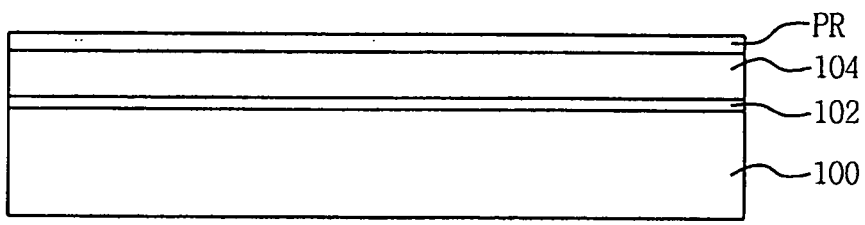

In FIG. 1b, photoresist PR is deposited on the semiconductor substrate 100 on which the first hard mask layer 104 is formed.

Figure 1C:
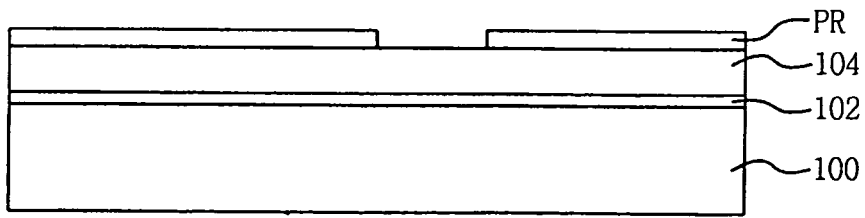

In FIG. 1c, the photoresist PR formed on the semiconductor substrate 100 is patterned through a photolithography process, to define an active region. Herewith, the photolithography process can be performed by aligning a photomask on the photoresist PR and by exposing in ultraviolet rays and then developing it, so as to obtain the pattern.

Figure 1D:
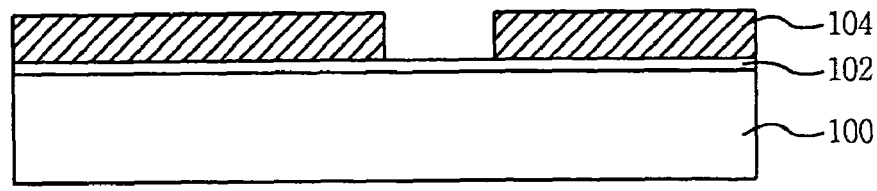

In FIG. 1d, the first hard mask layer 104 is etched to expose the first pad oxide layer 102 by using the photoresist PR as an etch mask. This etching process of the first hard mask layer 104 is performed to selectively etch the first hard mask layer 104 by using an anisotropy etching method and dry etch. Also the first pad oxide layer 102 serves as an etching stopper during the etching process of the first hard mask layer 104. Then the photoresist PR is removed.

Figure 1E:
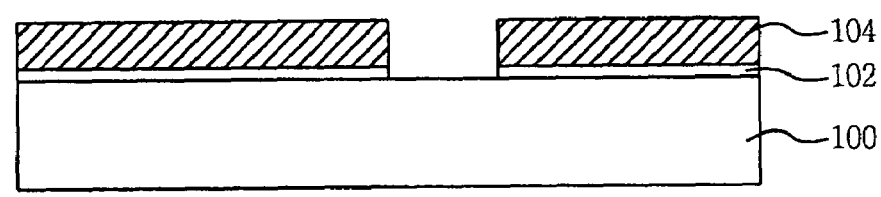

As shown in FIG. 1e, the first pad oxide layer 102 is removed to expose the semiconductor substrate 100 by using the first hard mask layer 104 as an etch mask. This etching process of the first pad oxide layer 102 is called a BT (Break-Through) process, and the BT process is performed as a dry etch. Furthermore, the surface of the semiconductor substrate 100 serves as an etching stopper during the etching process of the first pad oxide layer 102.

Figure 1F:
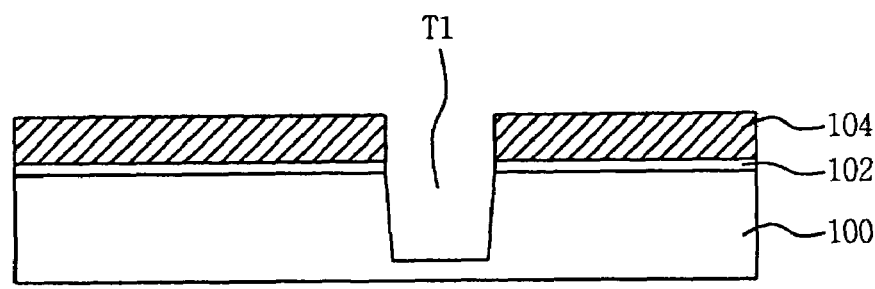

As shown in FIG. 1f, the surface of the semiconductor substrate 100 is etched to a predetermined depth by using the hard mask layer 104 and the first pad oxide layer 102 as an etch mask layer, to thus form a trench. Herewith the process of forming the trench by etching the semiconductor substrate 100 is called an ME (Main Etching) process. The BT and ME processes are performed in-situ within one reaction chamber. The ME process is also performed by a dry etching like the BT process, and this dry etching has mutually different etching rates in conformity with different kinds of reactive gases and layer material, thereby sequentially etching multilayer thin films. Herewith the trench T1 is formed to have a depth of about 2000 to 5000 angstroms.

Figure 1G:
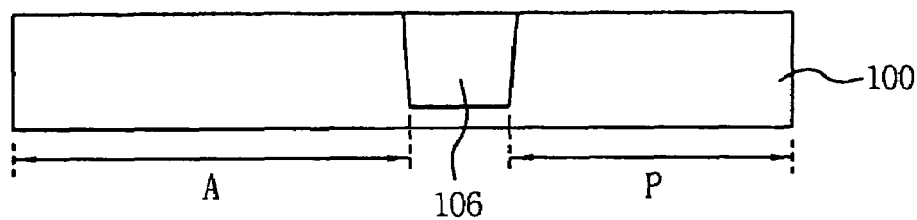

Referring to FIG. 1g, a device isolation film 106 is formed by using, for example, a silicon oxide layer within the trench T1 formed on the semiconductor substrate 100. The surface of the semiconductor substrate 100, which is exposed by a thermal oxidation process by using the first hard mask layer 104 as an oxidation prevention mask, is selectively oxidized, to form the device isolation film 106. Herewith, if the molding polysilicon layer is formed between the first pad oxide layer 102 and the first hard mask layer 104, the possibility of which is mentioned above, a stress based on a volume expansion generated in forming the device isolation film 106 is relaxed so as to be used as a buffer layer. Also the semiconductor substrate 100 having the formation of the device isolation film 106 is planarized using a chemical mechanical polishing (CMP) or etch back process. This planarizing process planarizes the surface of the semiconductor substrate 100 by removing the first hard mask layer 104 and the first pad oxide layer 102. Though not shown in the drawings, photoresist PR is deposited on the semiconductor substrate 100, and is patterned to expose the surface of the semiconductor substrate 100 where an NMOS transistor of a peripheral circuit region P defined by the device isolation film 106 is formed. Subsequently, N-type impurities are selectively ion implanted therein by using the photoresist PR as an ion implantation mask, and then the photoresist PR is removed.

Figure 1H:
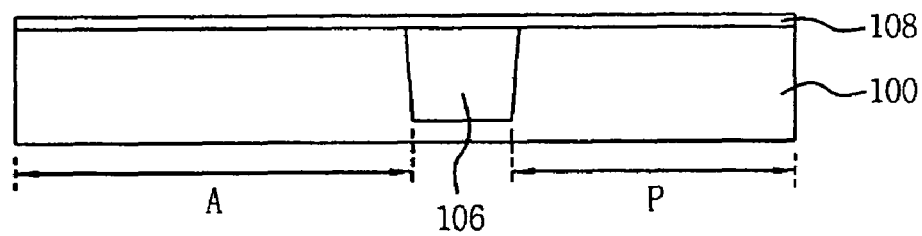

In FIG. 1h, a first dielectric layer 108 is formed to a thickness of about 30 to 50 angstroms on the semiconductor substrate 100 on which the device isolation film 106 is formed, by conventional techniques such as one using a thermal oxidation of an RTO (Rapid Thermal Oxide) system. This thermal oxidation is performed by using at least one reactive gas of $O_2$, NO, $N_2O$ and $NH_3$ under a low or high vacuum. That is, the first dielectric layer 108 is obtained by forming at least one of silicon oxide layer, silicon nitride layer and silicon oxide nitride layer on the semiconductor substrate 100.

Figure 1I:
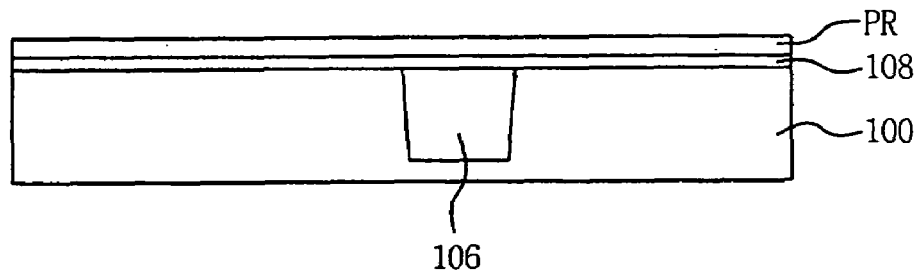

In FIG. 1i, a photoresist PR is deposited on the semiconductor substrate 100 on which the first dielectric layer 108 is formed.

Figure 1J:
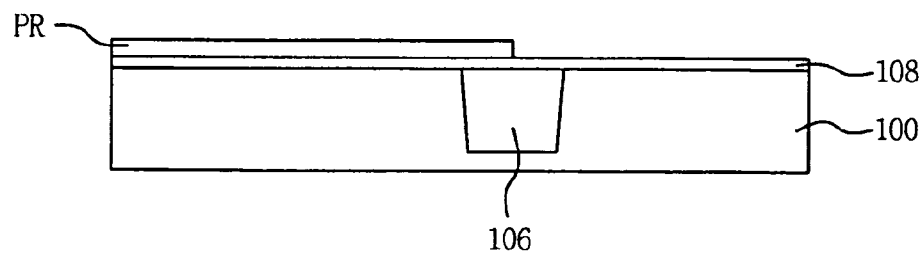

In FIG. 1j, the photoresist PR is patterned to expose the first dielectric layer 108 provided on the peripheral circuit region P through the photolithography process.

Figure 1K:
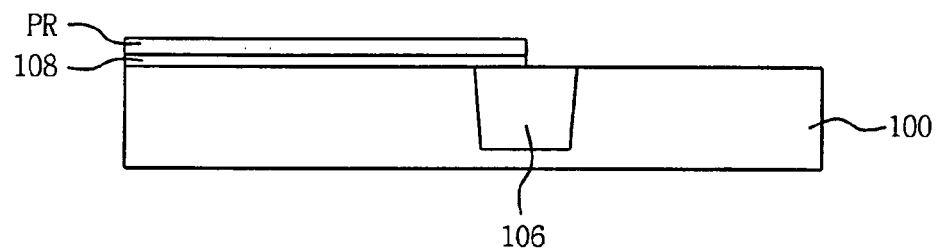

As shown in FIG. 1k, the first dielectric layer 108 is removed to expose the surface of the semiconductor substrate 100 and the device isolation film 106 provided on the peripheral circuit region P, through a wet process by using etching solution such as HF or $SF_6$, and by using the photoresist as an etch mask. At this time, if the first dielectric layer 108 is removed by a dry etch process, the surface of the semiconductor substrate 100 may be damaged. Thus the first dielectric layer 108 is removed by the wet etching method under a predetermined temperature. The first dielectric layer 108 can be removed by a general wet etching process for a dielectric layer such as a conventional silicon oxide layer. Then, the photoresist PR is removed.

Figure 1L:
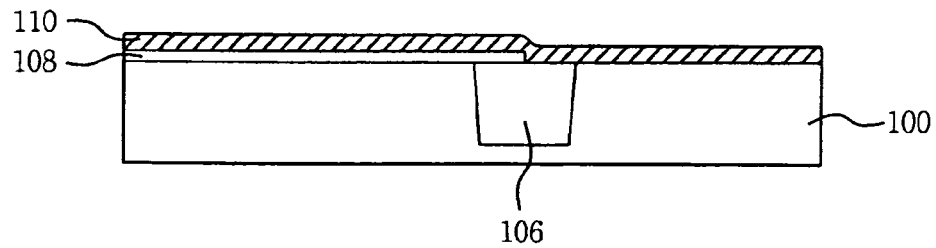

As shown in FIG. 1l, in the peripheral circuit region P, a second dielectric layer 110 is formed to a thickness of about 50 to 100 angstroms through a chemical vapor deposition (CVD) method on the semiconductor substrate 100 including the area from which a portion of the first dielectric layer 108 is removed. The second dielectric layer 110 comprises at least one of silicon nitride, aluminum oxide, titanium oxide, tantalum oxide and zirconium oxide which have a dielectric constant higher than that of the first dielectric layer 108. Herewith the CVD method is performed under a low vacuum or high vacuum of about $1.0 \times 10^{-4}$ Torr to $1.0 \times 10^{-8}$ Torr. That is, the inventive method of forming a dual gate dielectric layer forms a gate insulation layer by using a dielectric layer having a dielectric constant higher than that of a silicon oxide layer, and simultaneously, can solve an instability problem of the conventional wet etching process. Thus there is an advantage of using the dielectric layer as the gate insulation layer without the wet etching process for the dielectric layer having the dielectric constant higher than that of the silicon oxide layer. Subsequently, a gate stack is formed on the semiconductor substrate 100 on which the second dielectric layer 108 is formed, to thus form a transistor.

Consequently, the thick gate insulation layer including the first dielectric layer 108 and the second dielectric layer 110 is formed in the cell region A, and the relatively thin gate insulation layer formed of the second dielectric layer 110 is formed in the peripheral circuit region P. Thus, a transistor for use with a high voltage can be formed in the cell region A and a transistor for use with a low voltage can be formed in the peripheral circuit region P.

The inventive dual gate dielectric layer forming method can use, as the gate insulation layer, the second dielectric layer 110 having a dielectric constant higher than that of the first dielectric layer 108. In other words, the transistor performance can be significantly improved.

Figure 2A:
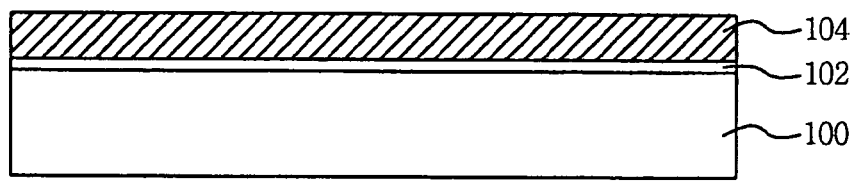
FIGS. 2a to 2t are cross-sectional views illustrating processes in a dual gate dielectric layer forming method to form a semiconductor device according to a second exemplary embodiment of the invention.
Figure 2B:
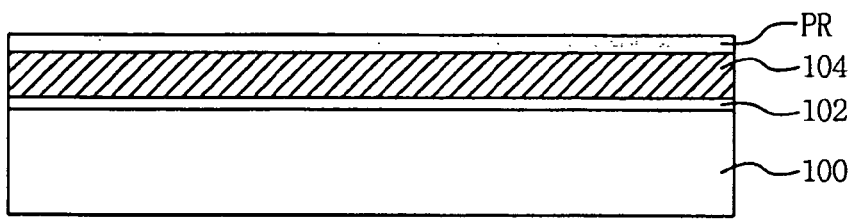
Figure 2C:
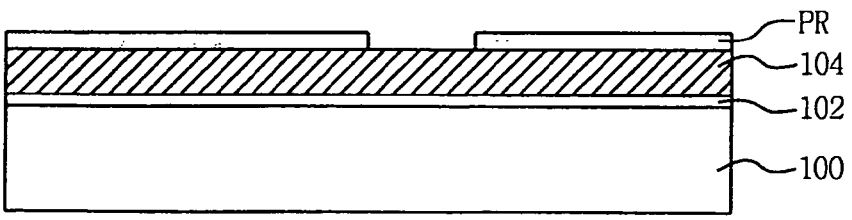
Figure 2D:
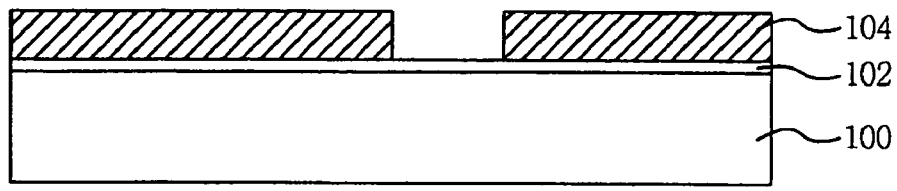
Figure 2E:
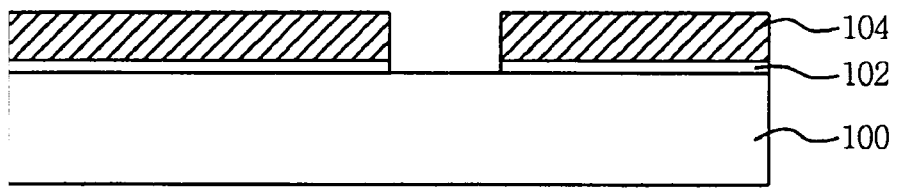
Figure 2F:
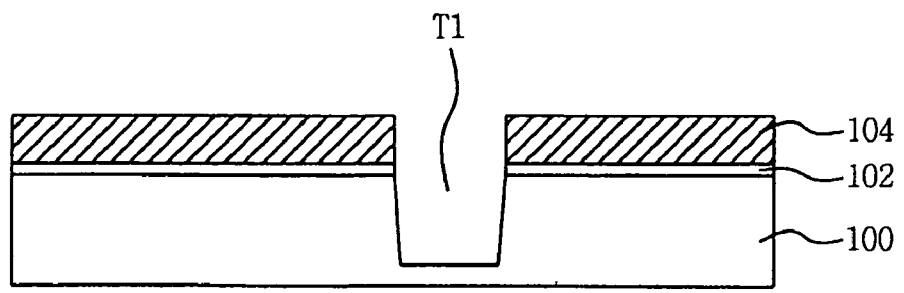
Figure 2G:
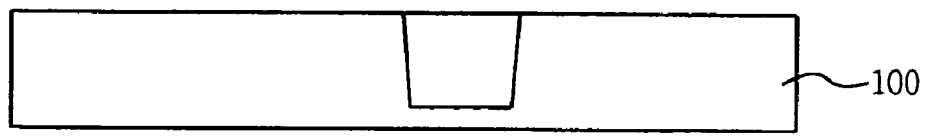
Figure 2H:
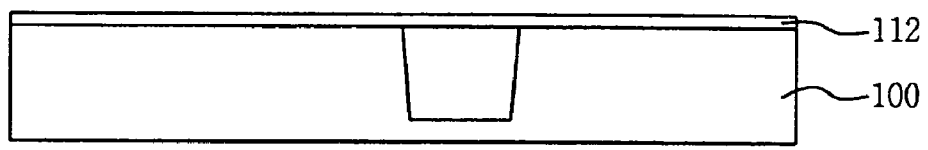
Figure 2I:
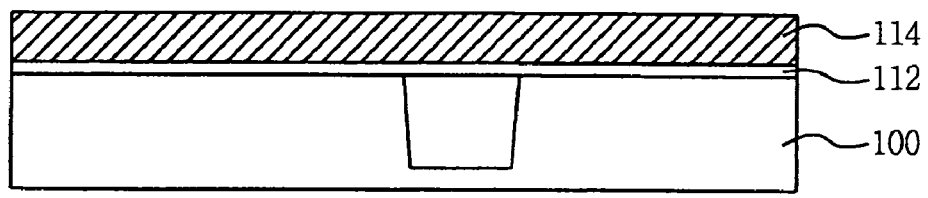
Figure 2J:
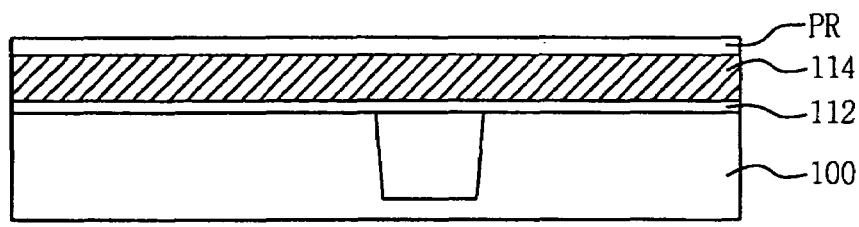
Figure 2K:
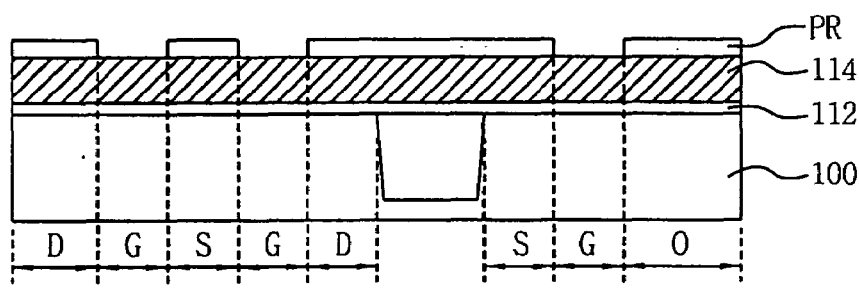
Figure 2L:
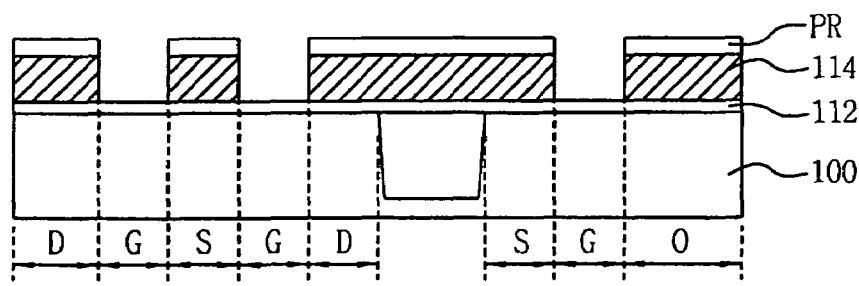
Figure 2M:
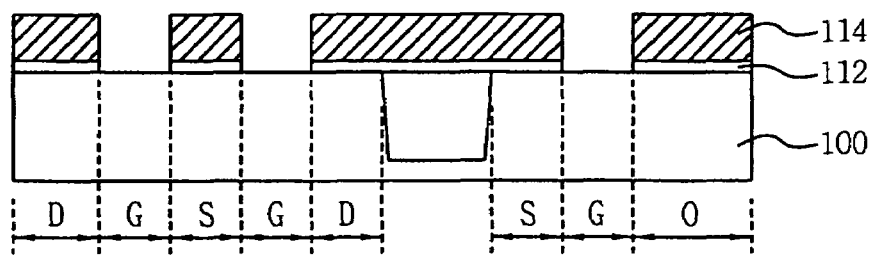
Figure 2N:
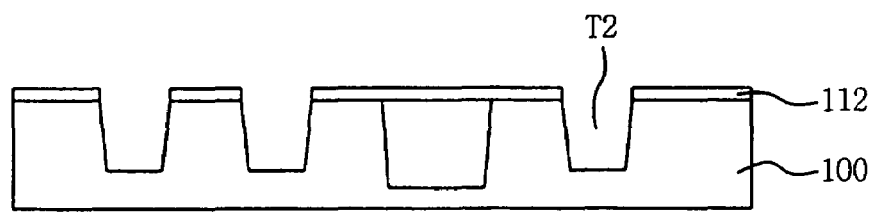
Figure 2O:
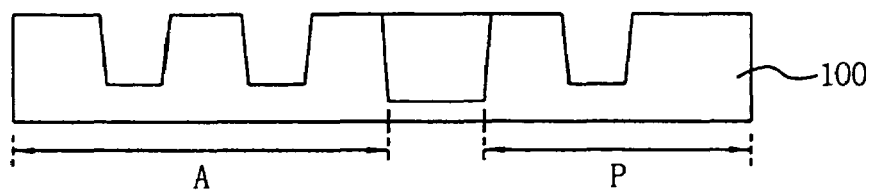
Figure 2P:
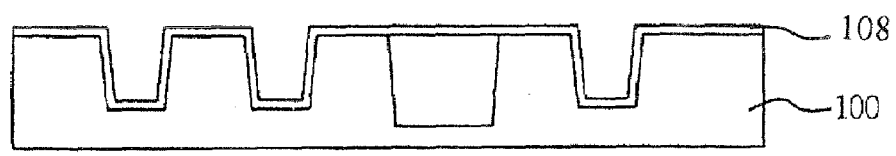
Figure 2Q:
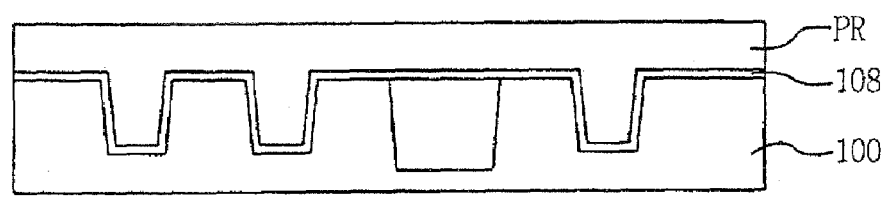
Figure 2R:
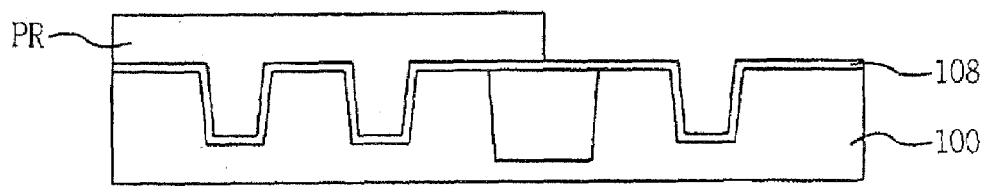
Figure 2S:
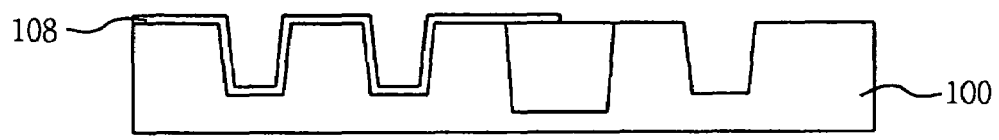
Figure 2T:
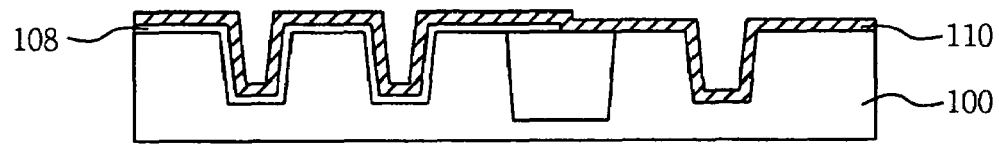

FIGS. 2a through 2t are cross-sectional views illustrating a dual gate dielectric layer forming method to manufacture a semiconductor device according to a second exemplary embodiment of the invention.

Referring to FIG. 2a, a first pad oxide layer 102 and a first hard mask layer 104 are sequentially formed on the semiconductor substrate 100. Herewith, the first pad oxide layer 102 is formed with a thickness of about 300 to 1000 angstroms by an MTO (Medium Temperature Oxide) method, and the first hard mask layer 104 is formed to a thickness of about 500 to 2000 angstroms by using a silicon nitride layer or silicon oxide nitride layer. Though not shown in the drawing, a molding polysilicon layer can be further formed between the first pad oxide layer 102 and the first hard mask layer 104.

As shown in FIG. 2b, a photoresist PR is deposited on the semiconductor substrate 100 on which the first hard mask layer 104 is formed.

As shown in FIG. 2c, the photoresist PR formed on the semiconductor substrate 100 is patterned by a photolithography process. The photolithography process is performed by aligning a photomask on the photoresist PR, sensitizing the photoresist PR exposed through the photomask by using ultraviolet rays and then by developing the photoresist PR to pattern the photoresist PR.

As shown in FIG. 2d, the first hard mask layer 104 is etched to expose the first pad oxide layer 102 by using the photoresist as an etch mask. Herewith, the etching process of the first hard mask layer 104 is performed by using an anisotropic dry etching process. Furthermore, the first pad oxide layer 102 during the etching process of the first hard mask layer 104 plays a role of an etching stop layer. Then the photoresist PR is removed.

Referring to FIG. 2e, the first pad oxide layer 102 is removed to expose a portion of the semiconductor substrate 100 by using the first hard mask layer 104 as an etch mask. Herewith, the etching process of the first pad oxide layer 102 is called a BT (Break-Through) process, the BT process is performed by using the dry etch method. The surface of the semiconductor substrate 100 during the etching process of the first pad oxide layer 102 plays a role of an etching stop layer.

As shown in FIG. 2f, the surface of the semiconductor substrate 100 is etched to a predetermined depth to form a trench T1, by using the first hard mask layer 104 and the first pad oxide layer 102 as an etch mask layer. Herewith, the process of etching the semiconductor substrate 100 and forming the trench is called an ME (Main Etching) process, and the BT process and the ME process may be performed in-situ within one reactive chamber. The ME process is performed by a dry etch method, like the BT process, and the dry etch method uses different kinds of reactive gases and has mutually different etching rates in conformity with a kind of layer material, thus multilayer thin layers can be sequentially etched. At this time, the trench T1 has a depth of about 2000 through 5000 angstroms from the surface of the semiconductor substrate 100.

With reference to FIG. 2g, the surface of the semiconductor substrate 100 exposed through a thermal oxidation process is selectively oxidized by using the first hard mask layer 104 as an oxide prevention mask, to thus form the device isolation film 106. Herewith, if a molding polysilicon layer is formed between the first pad oxide layer 102 and the first hard mask layer 104, it can be used as a buffer layer by relaxing a stress resulting from volume expansion generated in forming the device isolation film 106. Further, the semiconductor substrate 100 on which the device isolation film 106 is formed, is planarized using a chemical mechanical polishing (CMP) or etch back process. This planarizing process is performed to planarize the surface of the semiconductor substrate 100 by removing the first hard mask layer 104 and the first pad oxide layer 102.

As shown in FIGS. 2h through 2i, a second pad oxide layer 112 and a second hard mask layer 114 are sequentially formed on the semiconductor substrate 100 on which the device isolation film 106 is formed. The second pad oxide layer 112 is formed through the MTO method and the second hard mask layer 114 is formed through the CVD method using polysilicon.

In FIG. 2j, photoresist PR is deposited on the semiconductor substrate 100 on which the second hard mask layer 114 is formed.

In FIG. 2k, the photoresist PR is patterned to expose the second hard mask layer 114 of gate regions G by the photolithography process.

In FIG. 2l, the second hard mask layer 114 is etched to expose the second pad oxide layer 112 by the dry etching method by using the photoresist PR as an etch mask. Then the photoresist PR is removed. During a later process, the second hard mask layer 114 is now provided as a sacrificial layer and will be removed when forming a second trench T2, and the second pad oxide layer 112 serves as an etching stop layer when etching the second hard mask layer 114.

In FIG. 2m, the second pad oxide layer 112 is partially removed to expose the semiconductor substrate 100 through the dry etching method by using the second hard mask layer 114 as an etch mask.

With reference to FIG. 2n, the surface of the semiconductor substrate 100 is etched to a predetermined depth of the semiconductor substrate 100 by using the second hard mask layer 114 and the second pad oxide layer 112 as an etch mask. Likewise, the BE process of removing the second pad oxide layer 112, and the ME process of forming the second trench T2 by etching the surface of the semiconductor substrate 100, are performed in situ, with mutually different reactive gases within one etching device. Herewith, since a depth profile of the second trench may vary according to an open critical dimension, the second trench is formed to have a uniformed open critical dimension. For example, the second trench T2 may have an open critical dimension of about 700 to 900 angstroms and has a depth of about 1000 to 1500 angstroms.

Though not shown in the drawing, source and drain regions are separated by forming the second trench T2, then removing a sidewall of the second trench T2 through a CDE (Chemical Dry Etching) process of an isotropic etching method. At this time, since the isotropic etching method isotropically etches the surface of the semiconductor substrate 100 provided within the second trench T2, not only the sidewall of the second trench T2 but also the depth of the second trench T2 can be further extended. Also, an impurity region is formed by ion implanting an impurity in the semiconductor substrate 100 provided in a lower part and sidewall portion of the second trench T2. Herewith, the impurity region plays a role of a channel adjusting impurity doping region in order to overcome a short-channel effect.

In FIG. 2o, a dummy oxide layer (not shown) is formed on the semiconductor substrate 100 on which the second trench T2 is formed, by using conventional techniques such as a thermal oxidation process, so as to prevent damage on the surface of the semiconductor substrate 100, the damage being causable in forming the second trench T2. The dummy oxide layer and the pad oxide layer formed on the semiconductor substrate 100 are removed through a wet etch method.

In FIG. 2p, a first dielectric layer 108 is formed to a thickness of about 30 to 50 angstroms by using conventional techniques such as the thermal oxidation process or CVD process on the semiconductor substrate 100 on which the second trench T2 is formed. This first dielectric layer 108 can be formed of a silicon oxide layer, a silicon nitride layer or a silicon oxide nitride layer.

In FIG. 2q, photoresist PR is deposited on the semiconductor substrate 100 on which the first dielectric layer 108 is formed.

In FIG. 2r, the photoresist PR is patterned to expose the first dielectric layer 108 provided on an upper part of the peripheral circuit region P of the semiconductor substrate 100 on which the photoresist PR is deposited.

In FIG. 2s, the first dielectric layer 108 is removed by the wet etch method by using etching solution such as HF or $SF_6$ so as to expose the surface of the semiconductor substrate 100 and the device isolation film 106. Then, the photoresist PR is removed.

As shown in FIG. 2t, a second dielectric layer 110 having a dielectric constant higher than that of the first dielectric layer 108 is formed to a thickness of about 50 to 100 angstroms through the CVD method on the semiconductor substrate 100 in which the first dielectric layer 108 is selectively formed in the cell region A. At this time, the second dielectric layer 110 can be formed of at least one of materials such as silicon nitride, aluminum oxide, titanium oxide, tantalum oxide and zirconium oxide which have a dielectric constant higher than that of the silicon oxide layer and have high insulation characteristics. Thus, the inventive method of forming a dual gate dielectric layer can form a gate insulation layer by using a dielectric layer having a dielectric constant higher than that of a silicon oxide layer, and simultaneously can solve an instability problem of the conventional wet etching process. In addition, there is an advantage in that the dielectric layer can be used as the gate insulation layer without a wet etching process for the dielectric layer having a dielectric constant higher than that of a silicon oxide layer.

Then, a gate stack is formed on the semiconductor substrate 100 on which the second dielectric layer 108 is formed, to form a transistor having a recess structure.

The combination of the first dielectric layer 108 and the second dielectric layer 110 are formed in the cell region A, and the second dielectric layer is formed in the peripheral circuit region P. A transistor for use with a high voltage, which has a high stepped coverage of the gate insulation layer, can be formed in the cell region A, and a transistor for use with a low voltage, which has a low stepped coverage of the gate insulation layer, can be formed in the peripheral circuit region P.

The inventive method of forming the dual gate dielectric layer can increase the performance of the transistor having a recess structure, by using the second dielectric layer 110 having a dielectric constant higher than that of the first dielectric layer 108, as the gate insulation layer.

As described above, according to an exemplary embodiment of the invention, a method of forming a dual gate dielectric layer has advantages such that a gate insulation layer is formed by using a dielectric layer having a dielectric constant higher than that of a silicon oxide layer and that an instability problem of the conventional wet etching process can be also solved.

In addition, there is an advantage in that the dielectric layer can be used as the gate insulation layer without a wet etching process for the dielectric layer having a dielectric constant higher than that of the silicon oxide layer.

Embodiments of the invention may be practiced in many ways. What follows are exemplary, non-limiting descriptions of some of these embodiments.

According to one aspect of the invention, a method of forming a dual gate dielectric layer includes forming a first dielectric layer with a predetermined thickness on a semiconductor substrate; removing the first dielectric layer formed on a second region except a first region, the first and second regions being defined on the semiconductor substrate; and forming a second dielectric layer having a dielectric constant that of the first dielectric layer, on the first and second regions.

According to another aspect of the invention, a method of forming a dual gate dielectric layer includes forming a trench on first and second regions defined on a semiconductor substrate; forming a first dielectric layer with a predetermined thickness on the semiconductor substrate on which the trench is formed; removing the first dielectric layer formed on the second region; and forming a second dielectric layer having a dielectric constant higher than that of the first dielectric layer, on the first and second regions.

The inventive method improves the performance of the semiconductor device by forming the gate insulation layers having respective different thickness on the first and second regions by the use of the second dielectric layer having a dielectric constant higher than that of the first dielectric layer.

It will be apparent to those skilled in the art that modifications and variations can be made to the exemplary embodiments without deviating from the spirit or scope of the invention. Thus, it is intended that the invention cover any such modifications and variations of this invention provided they come within the scope of the appended claims and their equivalents. For example, the configuration in processing the semiconductor substrate or for layer material of the gate insulation layer, or its manufacturing process, can be varied diversely. Accordingly, these and other changes and modifications are seen to be within the true spirit and scope of the invention as defined by the appended claims.

The invention claimed is:

1. A method of forming a semiconductor device, the method comprising:

preparing a semiconductor substrate having first and second regions defined thereon;

forming a first trench in the first region and a second trench in the second region;

forming a first dielectric layer on the first and second regions of the semiconductor substrate to conformally cover inside surfaces of the first and second trenches, wherein a thickness of the first dielectric layer is substantially the same on the inside surfaces of the first trench as it is on a surface of the semiconductor substrate in the first region;

removing the first dielectric layer from the second region but leaving a portion of the first dielectric layer substantially on the first region; and forming a second dielectric layer having a dielectric constant higher than that of the first dielectric layer, on both the first and second regions, to conformally cover the inside surfaces of the first and second trenches, wherein a thickness of the second dielectric layer is substantially the same on the inside surfaces of the first and second trenches as it is on the surface of the semiconductor substrate in the first region and a surface of the semiconductor substrate in the second region.

2. The method of claim 1, further comprising forming a device isolation film between the first and second regions.

3. The method of claim 2, wherein forming the device isolation film comprises:
sequentially forming a pad oxide layer and a hard mask layer on the semiconductor substrate;
patterning photoresist on the hard mask layer, partially etching the hard mask layer by using the photoresist as an etch mask, and removing the photoresist;
etching a portion of the pad oxide layer and the semiconductor substrate, to form a trench in the semiconductor substrate;
removing the hard mask layer and the pad oxide layer and forming the device isolation film within the trench; and
planarizing the semiconductor substrate on which the device isolation film is formed.

4. The method of claim 3, wherein the oxide layer is formed by using a thermal oxidation method.

5. The method of claim 3, wherein the pad oxide layer is formed with a thickness of about 300 to 1000 angstroms.

6. The method of claim 3, wherein the bard mask layer is formed of a silicon nitride layer.

7. The method of claim 3, wherein the hard mask layer is formed through a chemical vapor deposition method.

8. The method of claim 3, wherein the bard mask layer is formed with a thickness of about 500 to 2000 angstroms.

9. The method of claim 3, wherein the device isolation film is formed of silicon oxide.

10. The method of claim 1, wherein the first dielectric layer is formed by a thermal oxidation method or a chemical vapor deposition method.

11. The method of claim 1, wherein the first dielectric layer is formed to a thickness of about 30 to 50 angstroms.

12. The method of claim 1, wherein the first dielectric layer is formed of a film selected from the group consisting oh silicon oxide film, a silicon oxide nitride layer, a silicon nitride layer and combination thereof.

13. The method of claim 1, wherein the second dielectric layer is formed by a chemical vapor deposition method.

14. The method of claim 1, wherein the second dielectric layer is formed by using at least one of silicon nitride, aluminum oxide. titanium oxide, tantalum oxide and zirconium oxide.

15. The method of claim 1, wherein the second dielectric layer is formed to a thickness of about 30 to 100 angstroms.

16. The method of claim 1, wherein the combined thickness of the first and second dielectric layers formed in the first region is greater than the thickness of the second dielectric layer formed in the second region.

17. The method of claim 1, wherein the first region is provided with a transistor for use with a high voltage by using the first and second dielectric layers as a gate insulation layer.

18. The method of claim 1, wherein the second region is provided with a transistor for use with a low voltage by using the second dielectric layer as the gate insulation layer.

19. The method of claim 1, wherein the second region is a peripheral circuit region.

20. A method of forming a semiconductor device having a dual gate dielectric layer, the method comprising:
forming a first trench to define first and second regions on a semiconductor substrate;
forming second trenches in the first and second regions;
forming a first dielectric layer overlying the first and second regions of the semiconductor substrate, wherein the first dielectric layer conformally covers inside surfaces of the second trenches, and wherein a thickness of the first dielectric layer is substantially the same on the inside surfaces of the first trench as it is on a surface of the semiconductor substrate in the first region;
removing the first dielectric layer from the second region but leaving a portion of the first dielectric layer substantially on the first region; and
forming a second dielectric layer having a dielectric constant higher than that of the first dielectric layer, on the first and second regions, wherein the second dielectric layer conformally covers the inside surfaces of the second trenches, and wherein a thickness of the second dielectric layer is substantially the same on the inside surfaces of the first and second trenches as it is on the surface of the semiconductor substrate in the first region and a surface of the semiconductor substrate in the second region.

21. The method of claim 20, wherein forming the first trench comprises:
sequentially forming a pad oxide layer and a hard mask layer on the semiconductor substrate;
patterning photoresist on the hard mask layer, partially etching the hard mask layer by using the photoresist as an etch mask, and removing the photoresist; and
etching the pad oxide layer by using the hard mask layer as an etch mask layer, and etching the semiconductor substrate to a predetermined depth, using the hard mask layer and the pad oxide layer as an etch mask, to form the first trench.

22. The method of claim 20, wherein the first trench is formed to have a critical dimension of about 700 to 900 angstroms.

23. The method of claim 20, wherein the first trench is formed to have a depth of about 1000 to 1500 angstroms.

24. A method of forming a semiconductor device, the method comprising:
forming a device isolation film to define first and second regions on a substrate;
forming one or more trenches in each of the first and second regions;
forming a first dielectric layer on the semiconductor substrate having the first and second regions, and to conformally cover inside surfaces of the one or more trenches, wherein a thickness of the first dielectric layer is substantially the same on the inside surfaces of the one or more trenches as it is on a surface of the substrate in the first region;
removing the first dielectric layer formed on the second region except the first region; and
forming a second dielectric layer, having a dielectric constant higher than that of the first dielectric layer, on the first and second regions, and to conformally cover the inside surfaces of the one or more trenches, wherein a thickness of the second dielectric layer is substantially the same on the inside surfaces of the one or more trenches as it is on the surface of the substrate in the first region and a surface of the substrate in the second region.

25. The method of claim 24, wherein the device isolation film is formed of a silicon oxide layer.

26. The method of claim 24, wherein the first dielectric layer is formed by a thermal oxidation method or a chemical vapor deposition method.

27. The method of claim 24, wherein the first dielectric layer is formed with a thickness of about 30 to 50 angstroms.

28. The method of claim 24, wherein the first dielectric layer comprises at least one of a silicon oxide film, a silicon oxide nitride layer and a silicon nitride layer.

29. The method of claim 24, wherein the second dielectric layer is formed by a chemical vapor deposition method.

30. The method of claim 24, wherein the second dielectric layer is formed by using at least one of silicon nitride, aluminum oxide, titanium oxide, tantalum oxide and zirconium oxide.

31. The method of claim 24, wherein the second dielectric layer is formed to a thickness of about 30 to 100 angstroms.

32. The method of claim 24, wherein the combined thickness of the first and second dielectric layers formed in the first region is greater than the thickness of the second dielectric layer formed in the second region.

* * * * *

UNITED STATES PATENT AND TRADEMARK OFFICE
CERTIFICATE OF CORRECTION

PATENT NO.       : 7,169,681 B2  Page 1 of 1
APPLICATION NO.  : 10/964170
DATED            : January 30, 2007
INVENTOR(S)      : Min-Hee Cho et al.

It is certified that error appears in the above-identified patent and that said Letters Patent is hereby corrected as shown below:

Column 9, line 26, the words "the oxide" should read -- the pad oxide --;
Column 9, line 30, the word "bard" should read -- hard --;
Column 9, line 34, the word "bard" should read -- hard --;
Column 9, line 46, the word "oh" should read -- of a --;
Column 9, line 51, the words "oxide. titanium" should read -- oxide, titanium --.

Signed and Sealed this

Second Day of September, 2008

JON W. DUDAS
*Director of the United States Patent and Trademark Office*